(12) United States Patent
Ermantraut et al.

(10) Patent No.: US 6,645,744 B2
(45) Date of Patent: *Nov. 11, 2003

(54) BATHS FOR PRODUCING MICROSTRUCTURES

(75) Inventors: Eugen Ermantraut, Jena (DE); Johann Michael Köhler, Golmsdorf (DE); Torsten Schulz, Jena (DE); Klaus Wohlfart, Laasan (DE)

(73) Assignee: Clondiag Chip Technologies GmbH, Jena (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/231,000

(22) PCT Filed: Aug. 22, 1997

(86) PCT No.: PCT/EP97/04589
§ 371 (c)(1),
(2), (4) Date: Feb. 5, 1999

(87) PCT Pub. No.: WO98/08145
PCT Pub. Date: Feb. 26, 1998

(65) Prior Publication Data
US 2001/0049131 A1 Dec. 6, 2001

(30) Foreign Application Priority Data
Aug. 23, 1996 (DE) .......................... 196 34 122

(51) Int. Cl.⁷ .............................. C12N 9/00; A23L 1/202
(52) U.S. Cl. ........................................ 435/183; 435/188
(58) Field of Search .................................. 435/183, 188

(56) References Cited

U.S. PATENT DOCUMENTS

| | | | |
|---|---|---|---|
| 5,069,906 A | * | 12/1991 | Cohen et al. |
| 5,362,413 A | * | 11/1994 | Kaufmann et al. |
| 5,527,487 A | * | 6/1996 | Mikkelsen et al. |
| 5,880,149 A | * | 3/1999 | Grinstaff et al. |

FOREIGN PATENT DOCUMENTS

| | | |
|---|---|---|
| DE | 2253944 | 5/1974 |
| DE | 4024748 | 3/1992 |
| GB | 1202592 | 8/1970 |
| JP | 55138741 | 10/1980 |
| JP | 60235132 | 11/1985 |

OTHER PUBLICATIONS

Adams et al., C & EN (Dec. 1995), pp. 32–41. Enzymes from microorganisms in extreme environments.*

* cited by examiner

*Primary Examiner*—Jon P. Weber
*Assistant Examiner*—Michele C. Flood
(74) *Attorney, Agent, or Firm*—Jordan and Hamburg LLP

(57) ABSTRACT

A bath for generating microstructures which is required in numerous fields of application of the microsystem technique and in microstructuring offers a less expensive alternative to known conventional approaches and disposal of the used bath may be carried out in a manner more environmentally friendly manner than in the previous methods for manufacture of microstructures. The bath includes at least one biogenic agent (in particular, an enzyme) which acts upon a preselectable thin layer.

5 Claims, No Drawings

BATHS FOR PRODUCING MICROSTRUCTURES

BACKGROUND OF THE INVENTION

The present invention relates to baths for generating microstructures which are required in numerous fields of application of microsystem technique and in microstructuring.

Moreover such baths enable microstructuring of such layers or layer systems, the application of which previously has been unusual in the foregoing fields of art. The application of the present invention is of particular advantage in structuring layer systems, the selective etching of which is critical when conventional etching means are used, due to the similar chemical behavior of the materials used. Moreover, utilization of conventional approaches has been feasible only by employing additional and expensive means, such as etching barriers or the like. Etching processes and developing processes previously used in microstructuring according to the state of art are generally based on poisonous chemicals which are harmful to health, as for example strong acids, lyes, and oxidants, or require extremely expensive processes, such as reactive ion etching and plasma etching, respectively, (refer to S. Büttgenbach, Mikromechanik, B. G. Teubner, Stuttgart, 1994).

SUMMARY OF THE INVENTION

It is an object of the present invention to provide novel baths for producing microstructures which offer a less expensive alternative to conventional approaches for producing such microstructures and for which disposal thereof is more friendly to the environment than in the known methods for manufacture of microstructures.

The object is realized by providing a bath comprising a solution containing at least one biogenic agent, for example, an enzyme, which effects a pre-selectable layer.

The invention is based on the discovery that, in the field of microstructuring, the masking layers which permit structurizing and which previously were employed to this end, such as photoresist layers may, by their very presence, locally affect the properties of biopolymer films. The essence of the invention resides in the intentional selection and in the application of biogenic agents, in particular enzymes, for the purpose of microstructuring of thin layers and, in a particularly advantageous way, of thin layer systems, respectively. The term "biogenic agent" refers generally to a biogenic substance which effects a layer to be structurized, and includes a substance consumed during the microstructuring process, such as, for example, a siderophore, as well as an enzyme, i.e., a substance which promotes a reaction, but which is not consumed during the structuring process.

When there is reference herein to the general term "baths" in the context of the invention, then the same are understood as applying to etching baths according to conventional and known technical solutions, as well as solutions which are intended for the formation of a structurized and masked layer.

Biopolymers, which have previously not been utilized in the field of microstructuring, are generally enzymatically degradable, just as a great number of organic and inorganic layers, and metals. Moreover, there are numerous disposable enzymes which, under modified conditions, can carry out reactions which are contrary to their original function. Thus, lipases, for example, react as acetylases in organic solutions.

Enzymes, under suitable conditions, are highly specific biogenic catalysts, which, in addition to their proper function, can be inhibited by specific inhibitors or competitors, the identity of which are generally known to those skilled in the art. Enzymatic reactions generally take place at ambient temperature and in mild buffer solutions which can be disposed of in an environmentally friendly manner. Enzymes themselves, according to their nature, are readily degradable biologically. Very often, enzymes are active in narrow temperature ranges. Hence, enzymes may also be selectively controlled thermally as to their activities. It is generally feasible to thermally deactivate common enzymes in a range of from 40 to 120° C., wherein, in most cases, a heating above 60° C. will be sufficient. Thus, solutions comprising at least one additive from enzymes and other biogenic agents, respectively, may be suitably employed as etching baths for microstructuring in accordance with the invention.

The invention will be explained in more detail in referring to five embodiments.

DETAILED DESCRIPTION OF THE INVENTION

In a first embodiment, a double layer system comprising two biopolymer layers is structurized. By way of illustrative example only, gelatin will be employed in the biopolymer double layer system of the first embodiment, without limiting the invention thereto. The desired objectives of the invention are achieved by virtue of the fact that different enzymes very often act in similar buffers with high efficiency and selectivity.

In accordance with the embodiment, a first gelatin layer of about 200 nm thickness is deposited on a substrate, for example, a cleaned silicon wafer. The first gelatin layer is then cross-linked by the addition of glutaraldehyde. A second layer comprised of gelatin to which short oligonucleotides (for example, 8mer) are added is deposited on the first cross-linked gelatin layer, and then the second layer is similarly cross-linked with glutaraldehyde. The thus formed double layer system, comprising the silicon substrate, the first gelatin layer in the lower position and the second gelatin-oligonucleotide layer in the upper position, is then coated with a masking layer, for example, a photoresist masking layer.

The oligonucleotides added to the gelatin comprising the above-described second gelatin-oligonucleotide layer have a sequence which has a specific junction for a restriction enzyme (for example, 5'-GAATTC-3' for EcoRI). A restriction enzyme of groupII is generally active in buffers which contain metal ions (for example, $Mg^{2+}$) in millimolar concentrations, and is employed in the example to selectively degrade the second layer. According to the disclosed example of the first embodiment, the first (and lower) gelatin layer is degraded by a protease (for example, protease K) as described more fully below. Very often, proteases are inhibited in their function by metal ions. For this reason, protease buffers very often include EDTA, EGTA and other chelating agents, the task of which is to eliminate metal contaminations contained in solutions.

In accordance with the first embodiment, the first and second chemically modified gelatin layers are consecutively degraded in a single step by the selective action of a restriction enzyme of the type mentioned above and a suitable protease, respectively. Such consecutive degradation of the first and second layers is achieved by using a buffer solution consisting of 10 mM NaCl, 5 mM $MgCl_2$, and 1% glycerol which inhibits activity of the protease, thereby preventing degradation of the first layer while the second (and upper) layer is selectively degraded in those portions which are uncovered by the masking layer by activity of the restriction enzyme which is unaffected by the metal ions in the buffer solution. When the degradation of the second layer is completed, which, in practice, can be monitored by microscope, a chelating agent (for example, 10 mM EDTA) is added to the buffer used, thereby activating the protease, which in turn selectively degrades the first (and lower) layer.

Alternatively, it is feasible to add the chelating agent to the second (and upper) gelatin-oligonucleotide layer during manufacture of such layer. The chelating agent will then be set free with progressing degradation of the oligonucleotides in the second layer. In such manner, the requirement for later addition of a chelating agent for the inactivation of the protease by the metal ions contained in the buffer solution is eliminated. Once activated, the protease is then capable of degrading the first (and lower) layer, as well as the restriction enzyme.

The allosteric regulation of the foregoing enzymes by way of metal ions is counteractive, permitting a successive application. There are also proteases which are only able to function by utilizing metals, and which would permit a simultaneous application (for example, the family of zinc proteases, such as carpoxypeptidase A). Furthermore, and according to the present state of biotechnological research, it is feasible to produce metal resistant or metal sensitive mutations of the enzymes without foreseeable and significant obstacles.

In a second embodiment, the application of a bath according to the invention for producing a self-supporting membrane will be disclosed. A thin biopolymeric layer of about 200 nm thickness is applied to a cleaned silicon wafer by spin-coating. In the present example, the layer is comprised of 10% gelatin dissolved in water, to which 5% glutaric dialdehyde is added. Such layer is not water-soluble, and is resistant to conventional photoresist coating developers. In the present example, a subsequent coating is applied in the form of an image reversal photoresist. Such photoresist layer is appropriately treated according to conventional practice, masked according to a desired subsequent structure, exposed, and structurized. The entire sandwich assembly which includes the silicon wafer, the cross-linked gelatin layer, and the structurized photoresist layer is then inserted into an enzymic bath. In the specific case in which gelatin is utilized for the biopolymer layer, the enzymic bath preferably consists of a protease K-buffer substantially constituted of 10% SDS, 10 mM NaCl, 10 mM EDTA and 10 mM Tris-HCl, to which 10 mg/ml protease K is added. The pH-value of such bath is set to 8.5. When such an enzymic bath is employed, a gelatin layer of, for example, about 200 nm thickness is entirely degraded at ambient temperature within about 8h. The result of the above-described process is the production of a self-supporting photoresist membrane which is liberated from the silicon substrate by the degradation of the intermediate biopolymeric (for example, gelatin-based, in the present example) layer.

In a third embodiment, a bath according to the invention will be described, an action of which provides a degradation stop (in analogy to known etching stop layers).

When a selected layer is to be advantageously protected against external influences and at the same time reliably set free from a substrate on which it is initially formed, for example, when producing thin structurized membranes, which are described by way of example using gelatin, such gelatin layer which later forms the membrane is doped by metals or specific inhibitors for degradation of the enzyme employed. Such inhibitors are generally artificial analogues of the transition states of the substrate which has to be enzymatically decomposed and have bonds which are not decomposable by the enzyme. For example, such inhibitors would have ether bonds which are not decomposable by proteases which decompose peptide bonds. A first thin layer prepared in this manner to include such metals or specific inhibitors is provided with a second thin layer of agarose having a thickness of about 1 $\mu$m. After applying a masking layer to the second thin layer, the second layer is provided with a desired recess by employing a bath consisting of 0.1 g/ml agarase, 5 mM EDTA, 10 mM NaCl, and 10 mM $Na_2HPO_4$. When the degradation has progressed to the prepared first thin layer, the agarase is inhibited by release of the doped inhibitors provided in the first layer, halting the progress of further degradation.

In a fourth embodiment, the application of a bath according to the invention to structurize a double layer system formed of gelatin and agarose is achieved. In the present embodiment, two enzymes are added to the bath consisting of 5 mM NaCl, 5 mM $Na_2HPO_4$, 0.1 g/ml agarase, and 1 mg/ml thermoresistant proteinase, recovered from a thermophilic organism (for example, any suitable organism of the species Thermus). The agarase is characterized by being active at ambient temperature, at which the thermoresistant proteinase does not exhibit any detectable activity. In this first step of degradation, only the desired structure of the upper layer consisting of agarose is removed. Then, the temperature of the bath is increased to 72° C., and the proteinase is thus activated, whereas the agarase no longer demonstrates any detectable activity. Only the degradation of the lower gelatin layer of the double layer system is then carried out.

In a fifth embodiment, the structurizing of a thin layer system comprised of iron-gelatin-lipid by virtue of at least one bath according to the invention will be disclosed. A solution is used, to which a siderophore, such as aerobactin or enterobactin, is added in a concentration of about 10 mg/ml. As noted above herein, a siderophore is a biogenic agent of the type which is consumed during the degradation process rather than an enzyme. In unmasked portions, the iron (Fe) layer of about 100 nm thickness is degraded after about 1h at a temperature of 20° C. The buffer solution according to the second embodiment further includes a proteinase effective to remove the gelatin layer under the mask which has been predetermined by the generated Fe-structure matching an initially applied mask pattern, such degradation of the intermediate gelatin layer thereby releasing the iron layer from the lipid layer. The lipid layer can be structurized by way of an aqueous solution consisting of 1% glycerol and 1 mg/ml lipase which is suited for degrading such lipid layer. In such manner, three layers, i.e. iron, gelatin and lipid, are broken down selectively and in a controled manner by three biogenic agents. of about 100 nm thickness is degraded after about 1h at a temperature of 20° C. The buffer solution according to the second embodiment further includes a proteinase effective to remove the gelatin layer under the mask which has been predetermined by the generated Fe-structure matching an initially applied mask pattern, such degradation of the intermediate gelatin layer thereby releasing the iron layer from the lipid layer. The lipid layer can be structurized by way of an aqueous solution consisting of 1% glycerol and 1 mg/ml lipase which is suited for degrading such lipid layer. In such manner, three layers, i.e. iron, gelatin and lipid, are broken down selectively and in a controled manner by three biogenic agents.

The invention is not intended to be limited to the precise baths as disclosed in the foregoing embodiments. The selection of a special relevant biogenic agent, in particular an enzyme, with respect to an actual case of a thin layer to be structurized can be carried out without any further inventional activity and under use of biotechnological skill known to those skilled in the art.

What is claimed is:

1. A bath for generating microstructures in a layer system, the layer system including at least two layers arranged in a particular layer sequence, said at least two layers including a first layer and a second layer, the bath comprising:

a solution including at least two biogenic agents, said at least two biogenic agents including a first biogenic agent and a second biogenic agent each having an activity effective for degrading at least a respective one of said first and second layers, wherein said first and second biogenic agents are selected for activation at different temperatures, and wherein said solution is brought into contact with the layer system.

2. A method of using a bath according to claim 1, wherein at least one inhibiting agent selected from the group consisting of inhibitors and competitors is addad to in said solution by at least one of insertion into said solution during a degradation process and incorporation into at least one of said at least two layers of said layer system to be structurized such that said inhibiting agent is released into said solution when said at least one of said at least two layers is degraded, and said at least one inhibiting agent inactivate a given one of said at least two biogenic agents.

3. A bath according to claim 1, wherein at least one of said first and second biogenic agents is an enzyme.

4. A bath according to claim 1, wherein, when each of said first and second biogenic agents are active, effectiveness of each of said first and second biogenic agents is specific for degrading a respective one of said first and second layers.

5. A bath according to claim 1, wherein:

at least one of said first and second layers comprises of a biopolymer; and at least one said first and second biogenic agents degrades said at least one of said first and second layers.

* * * * *